(12) United States Patent
Shah et al.

(10) Patent No.: US 9,570,160 B1
(45) Date of Patent: Feb. 14, 2017

(54) NON-VOLATILE STORAGE SYSTEM WITH DEFECT DETETCTION AND EARLY PROGRAMMING TERMINATION

(71) Applicant: SANDISK TECHNOLOGIES INC., Plano, TX (US)

(72) Inventors: Grishma Shah, Milpitas, CA (US); Deepanshu Dutta, Fremont, CA (US); Sarath Puthenthermadam, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/967,157

(22) Filed: Dec. 11, 2015

Related U.S. Application Data

(60) Provisional application No. 62/248,187, filed on Oct. 29, 2015.

(51) Int. Cl.
| | | |
|---|---|---|
| *G11C 11/56* | (2006.01) | |
| *G11C 29/08* | (2006.01) | |
| *G11C 16/10* | (2006.01) | |
| G11C 29/04 | (2006.01) | |
| G06F 12/02 | (2006.01) | |
| G11C 29/42 | (2006.01) | |

(52) U.S. Cl.
CPC ........... *G11C 11/5628* (2013.01); *G11C 16/10* (2013.01); *G11C 29/08* (2013.01); *G06F 12/0246* (2013.01); *G11C 29/04* (2013.01); *G11C 29/42* (2013.01)

(58) Field of Classification Search
CPC ..... G11C 11/5628; G11C 29/08; G11C 16/10; G11C 29/04; G11C 29/42; G06F 12/0246
See application file for complete search history.

(56) References Cited

U.S. PATENT DOCUMENTS

| | | | |
|---|---|---|---|
| 5,465,233 A | 11/1995 | Slemmer | |
| 6,111,799 A | 8/2000 | Uchida | |
| 6,781,902 B2 | 8/2004 | Oumiya | |
| 7,257,038 B2 | 8/2007 | Killian | |
| 7,304,893 B1 * | 12/2007 | Hemink | G11C 16/12 365/185.09 |
| 7,440,347 B1 | 10/2008 | Vogelsang | |
| 7,965,577 B2 | 6/2011 | Chen | |
| 8,305,807 B2 | 11/2012 | Shah | |
| 8,379,454 B2 | 2/2013 | Kochar | |
| 8,432,732 B2 | 4/2013 | Li | |
| 8,630,118 B2 | 1/2014 | Sakai | |
| 8,730,722 B2 | 5/2014 | Koh | |
| 8,775,901 B2 | 7/2014 | Sharon | |
| 8,964,480 B2 | 2/2015 | Mui | |
| 9,009,568 B2 | 4/2015 | Luo | |

(Continued)

OTHER PUBLICATIONS

Tseng, et al., U.S. Appl. No. 14/525,813, filed Oct. 28, 2014.

*Primary Examiner* — Pho M Luu
*Assistant Examiner* — Ajay Ojha
(74) *Attorney, Agent, or Firm* — Vierra Magen Marcus LLP

(57) ABSTRACT

A non-volatile storage system includes defect detection and early program termination. The system commences programming of a plurality of non-volatile memory cells, determines that a defect condition exists and, in response to determining that the defect condition exists, terminates the programming of the plurality of memory cells prior to completion of programming.

20 Claims, 14 Drawing Sheets

(56) References Cited

U.S. PATENT DOCUMENTS

| | | |
|---|---|---|
| 9,026,757 B2 | 5/2015 | Li |
| 9,065,481 B2 | 6/2015 | Meaney |
| 9,135,989 B2 | 9/2015 | Sakai |
| 2005/0160332 A1* | 7/2005 | Hirabayashi ............ G11C 29/42 714/718 |
| 2008/0126676 A1* | 5/2008 | Li ........................ G11C 11/5628 711/103 |
| 2008/0273388 A1* | 11/2008 | Chin .................. G11C 11/5628 365/185.17 |
| 2009/0094482 A1 | 4/2009 | Zilberman |
| 2010/0172179 A1* | 7/2010 | Gorobets ............ G06F 12/0246 365/185.09 |
| 2011/0063918 A1 | 3/2011 | Pei |
| 2011/0096601 A1 | 4/2011 | Gavens |
| 2011/0099418 A1 | 4/2011 | Chen |
| 2011/0099460 A1 | 4/2011 | Dusija |
| 2012/0008384 A1 | 1/2012 | Li |
| 2012/0008410 A1 | 1/2012 | Huynh |
| 2013/0128665 A1 | 5/2013 | Mokhlesi |
| 2013/0322171 A1* | 12/2013 | Lee ........................ G11C 29/04 365/185.03 |
| 2014/0269071 A1 | 9/2014 | Pandya |
| 2015/0006976 A1 | 1/2015 | Jeon |
| 2015/0085575 A1 | 3/2015 | Tam |
| 2015/0301885 A1 | 10/2015 | Yuan |

* cited by examiner

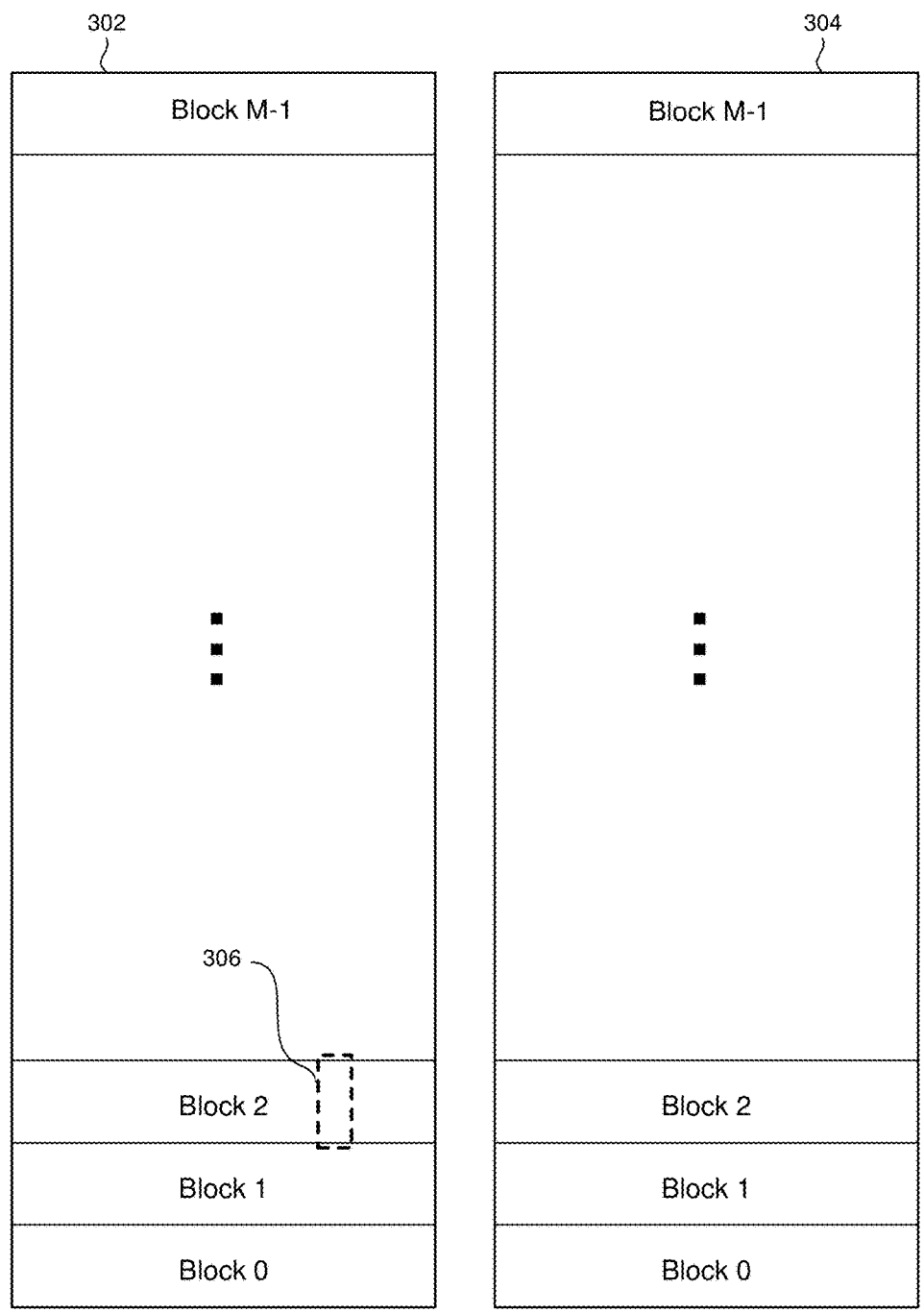

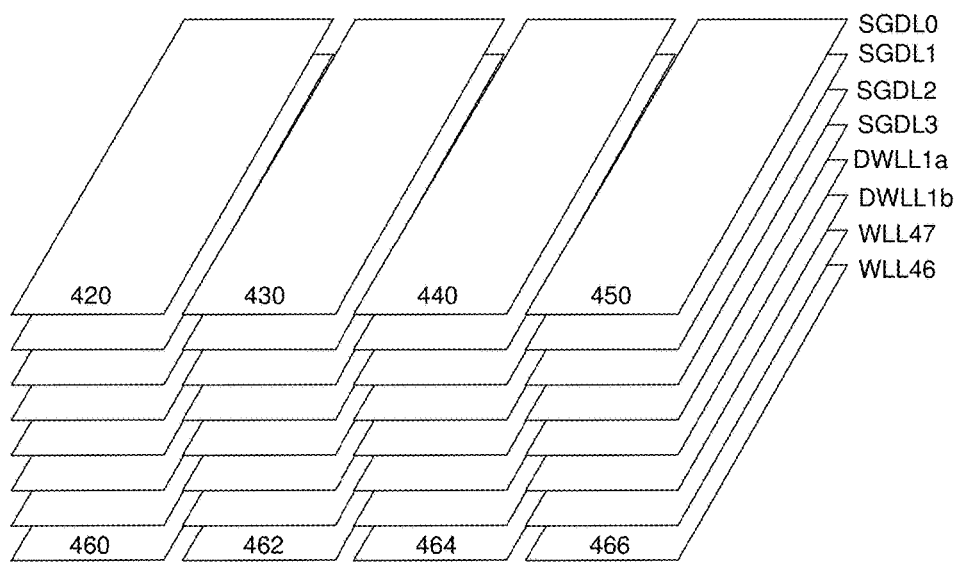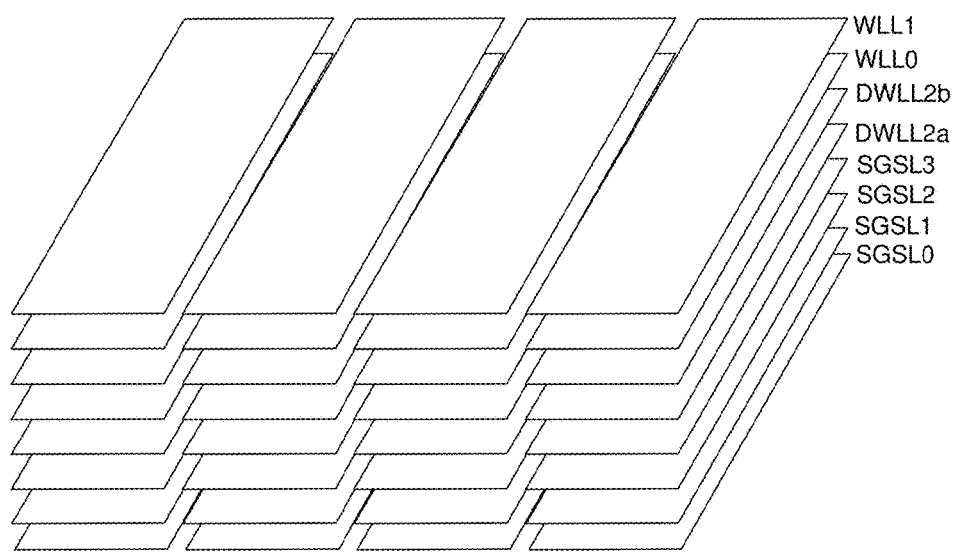
Figure 4D

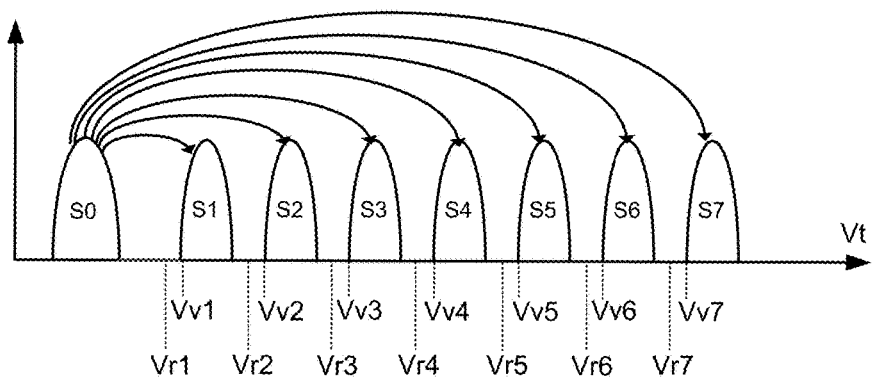
Fig. 5
Fig. 5F
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
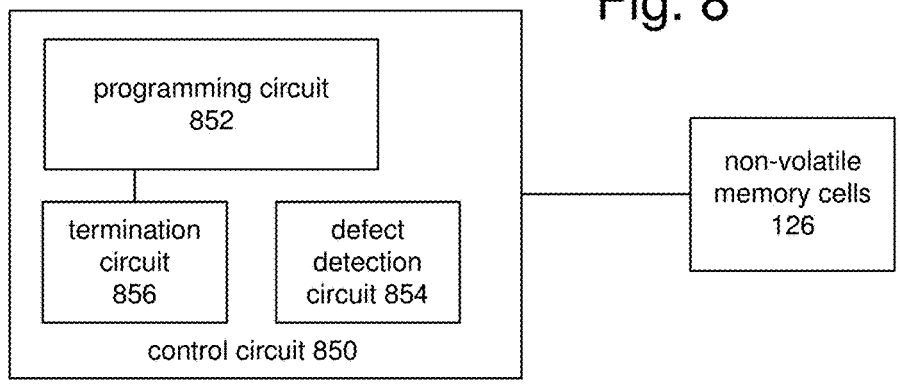
Fig. 8

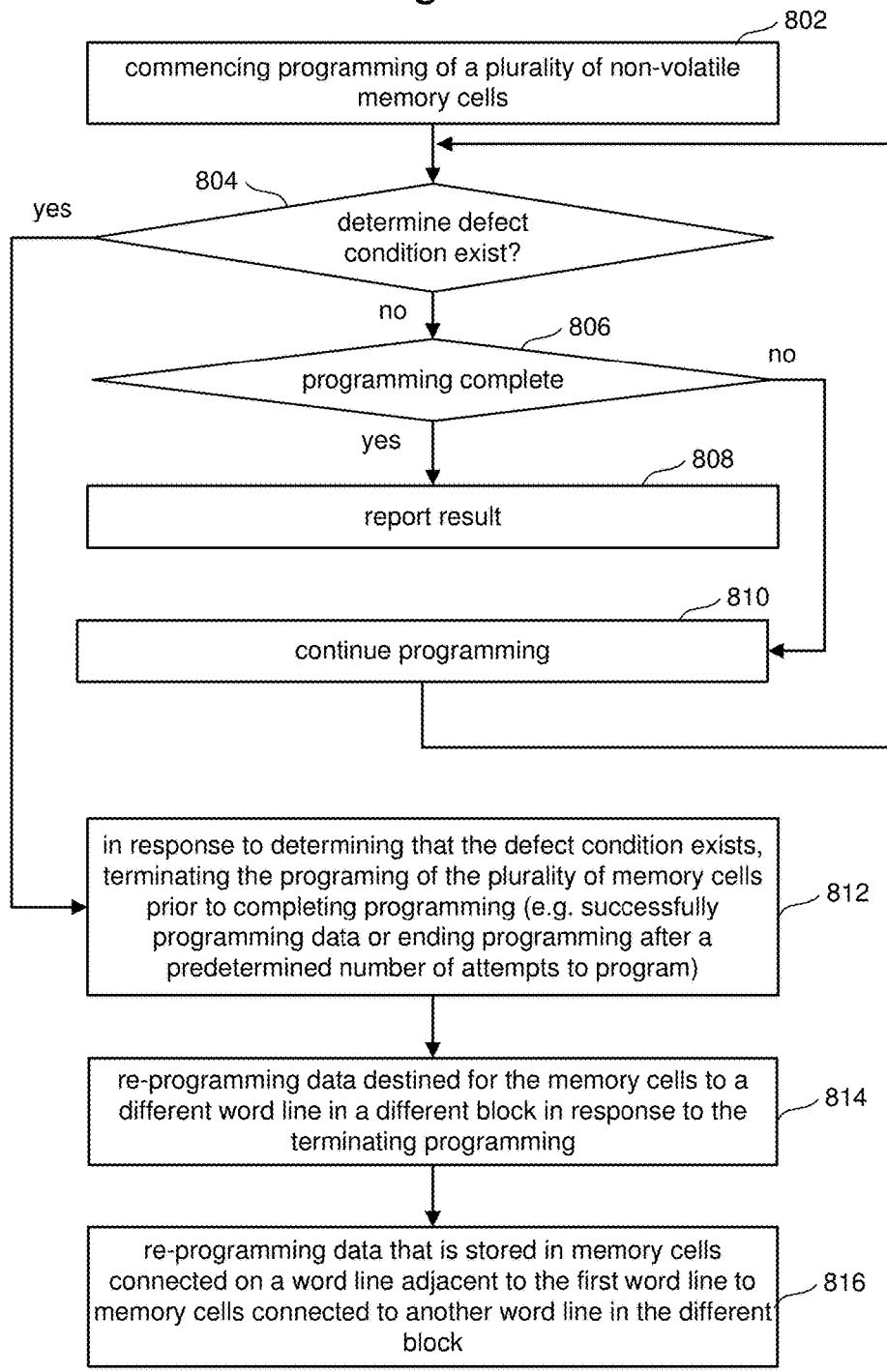

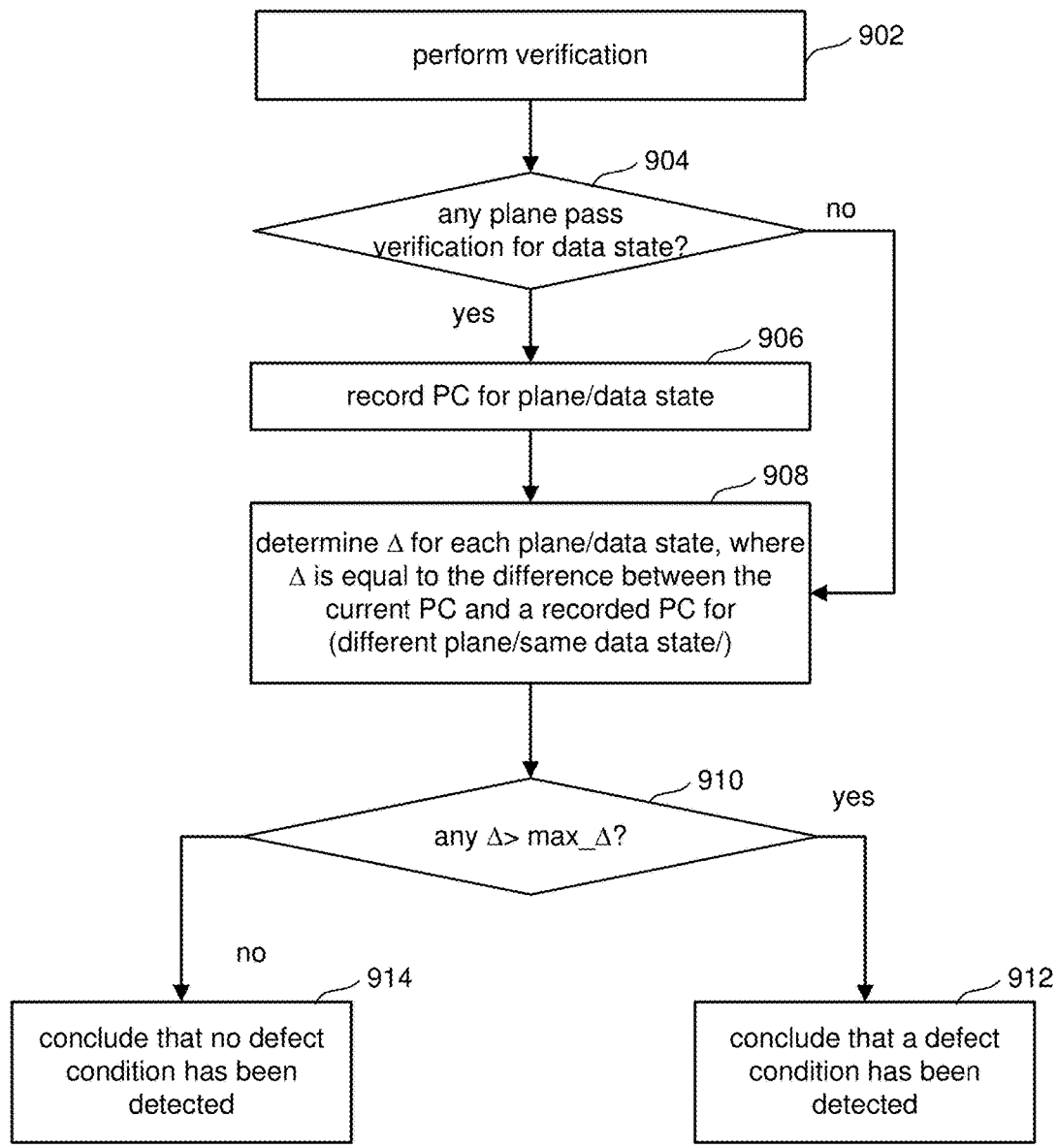

NON-VOLATILE STORAGE SYSTEM WITH DEFECT DETETCTION AND EARLY PROGRAMMING TERMINATION

This application claims the benefit of U.S. Provisional Application 62/248,187, "NAND Defect Detection Using State Dependent Program Loop Comparison," filed on Oct. 29, 2015.

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. However, scaling the sizes of memory cells entails certain risks. In order to achieve the advantage of higher memory capacity for a fixed die size, these smaller memory cells must be packed more closely together. Doing so, however, may result in a greater number of manufacturing defects, such as shorting between adjacent word lines, shorting between word lines and interconnects, shorting between word lines and the substrate, broken word lines, etc. Such defects often result in corruption of data stored on the word lines being programmed and nearby word lines. In some cases, these defects are not realized during tests conducted by manufacturers prior to packaging and shipping. Rather, these defects only begin to corrupt data after programming and erasing is performed by the user.

Prior systems have sought to combat latent manufacturing defects by reading programmed data after programming or evaluating performance after completing programming. However, by the time programming has completed, the programming process may have already damaged data being stored in other nearby memory cells.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 5 depicts threshold voltage distributions.

FIG. 5F is a table depicting an example data encoding.

FIG. 7 is a flow chart describing one embodiment of a process for programming and managing defects.

FIG. 8 is a block diagram of one embodiment of a memory device.

FIG. 9 is a flow chart describing one embodiment of a process for determining whether a defect condition exists.

DETAILED DESCRIPTION

Technology is proposed for terminating a programming process early when a defect condition exists in order to avoid unnecessary damaging of data stored in nearby memory cells. Rather than wait for a programming process to end in order to determine whether a defect condition exists, the proposed system tests for the defect condition during the programming process. If a defect condition is identified, the programming process is stopped prior to completing programming By stopping the programming process earlier than if the programming process was completed, other memory cells are less likely to be damaged by the defects.

The following discussion provides details of one example of a suitable structure for memory devices that can implement the proposed technology.

Figure 1:
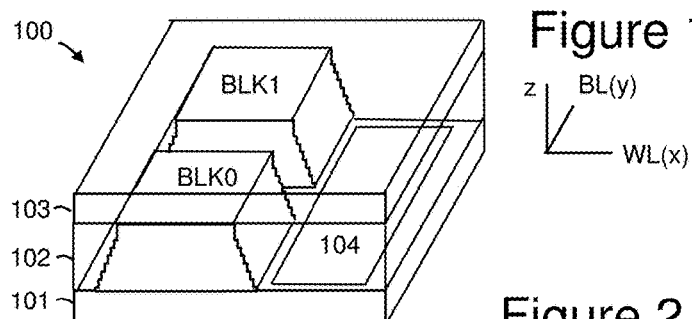
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
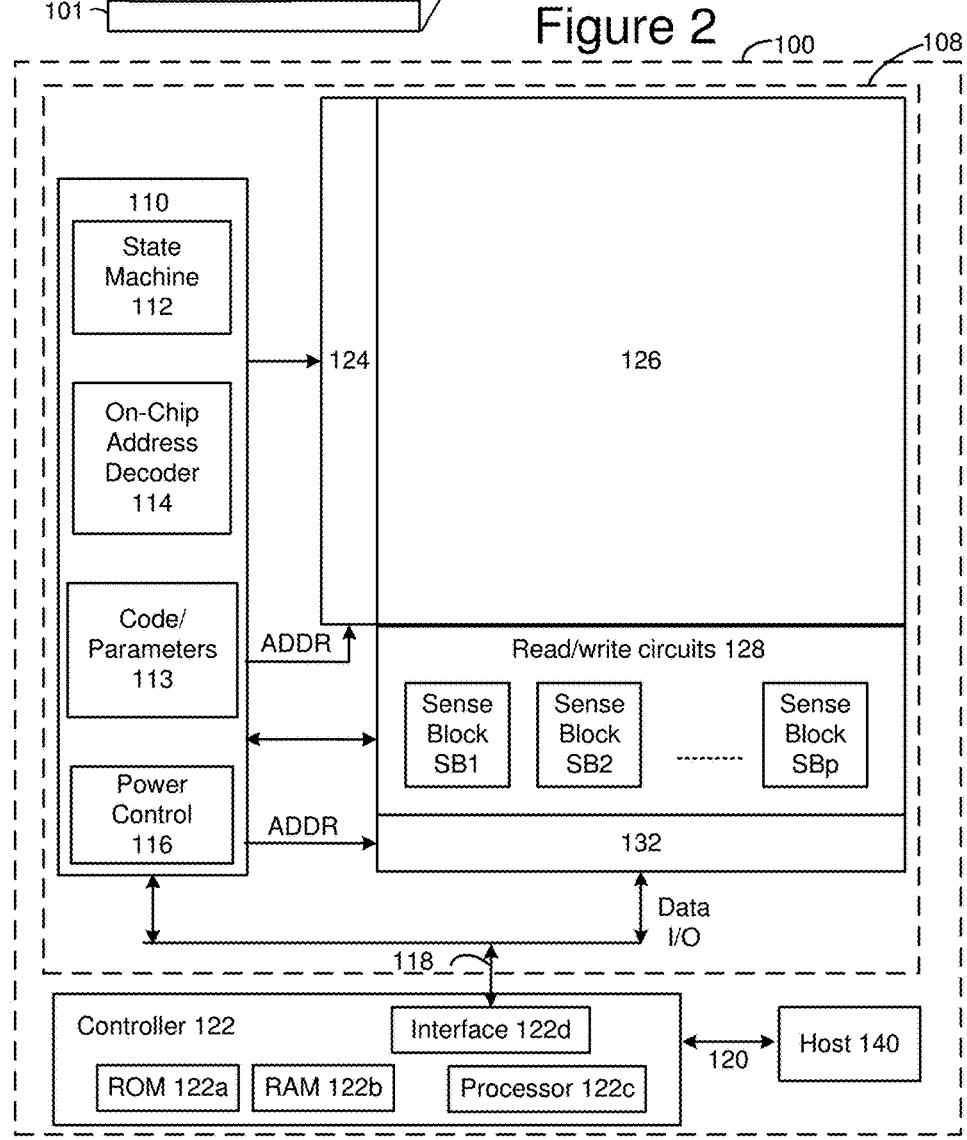
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c, ROM 122a, RAM 122b and a Memory Interface 122d. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between controller 122 and memory die 108. For example, memory interface 122d can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
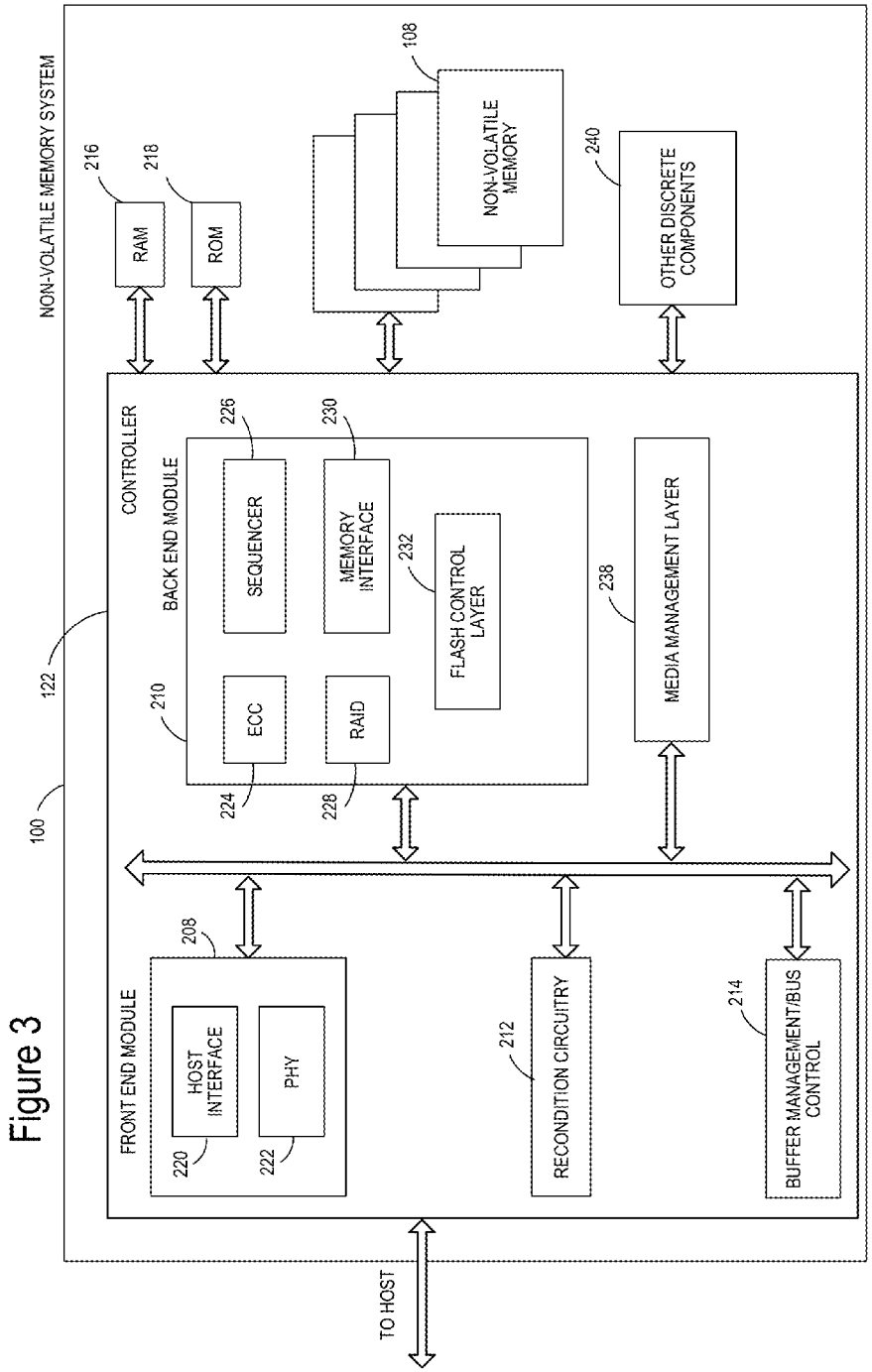
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing word line maintenance, as described herein.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Drives) module 228 manages generation of RAID parity and recovery of failed data. The RAID parity may be used as an additional level of integrity protection for the data being written into the non-volatile memory system 100. In some cases, the RAID module 228 may be a part of the ECC engine 224. A memory interface 230 provides the command sequences to non-volatile memory die 108 and receives status information from non-volatile memory die 108. In one embodiment, memory interface 230 may be a double data rate (DDR) interface, such as a Toggle Mode

200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The FTL or MML 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. For example, some systems may have more than two planes. Other systems may only have one plane.

Figure 4B:
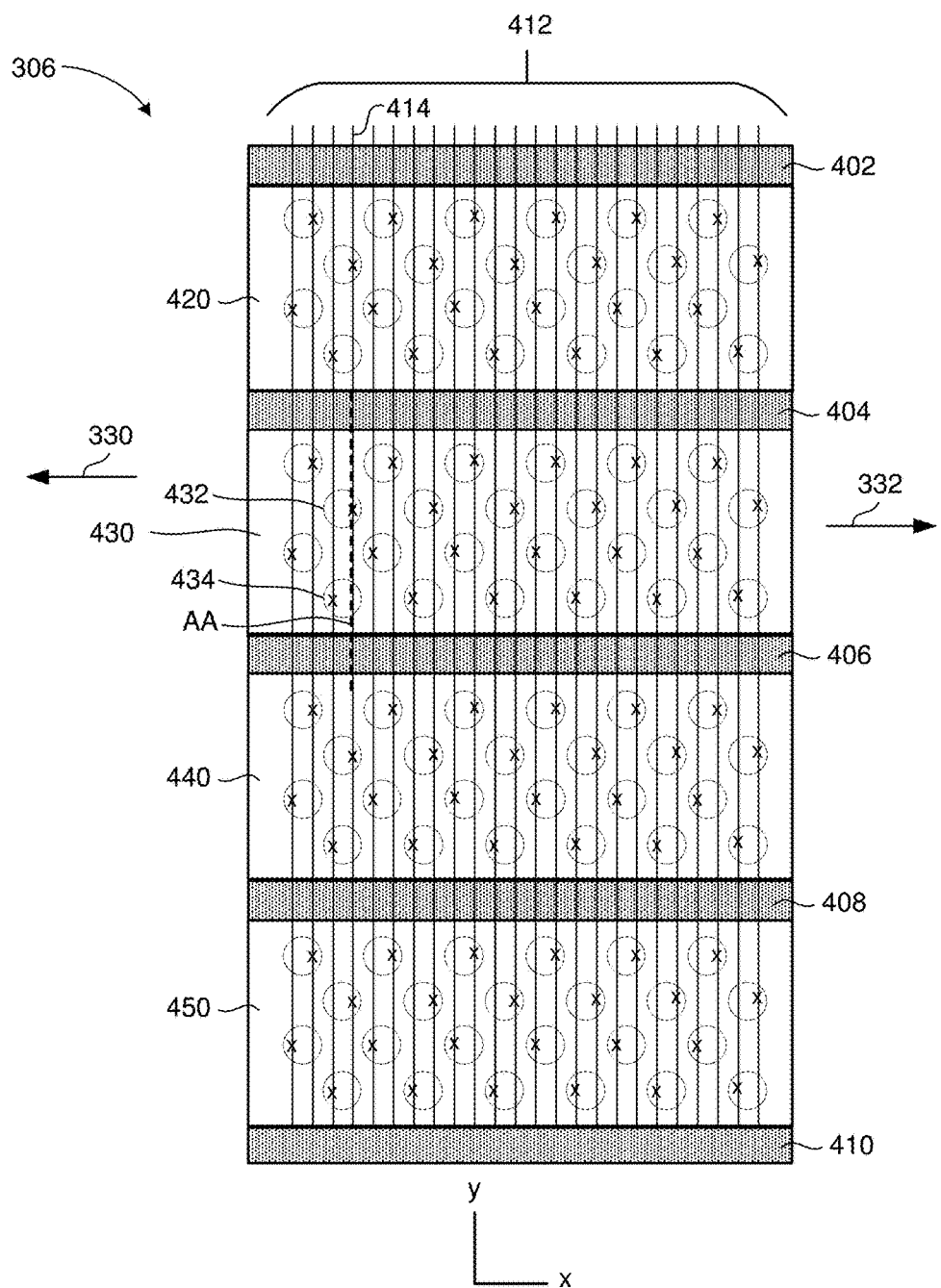
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
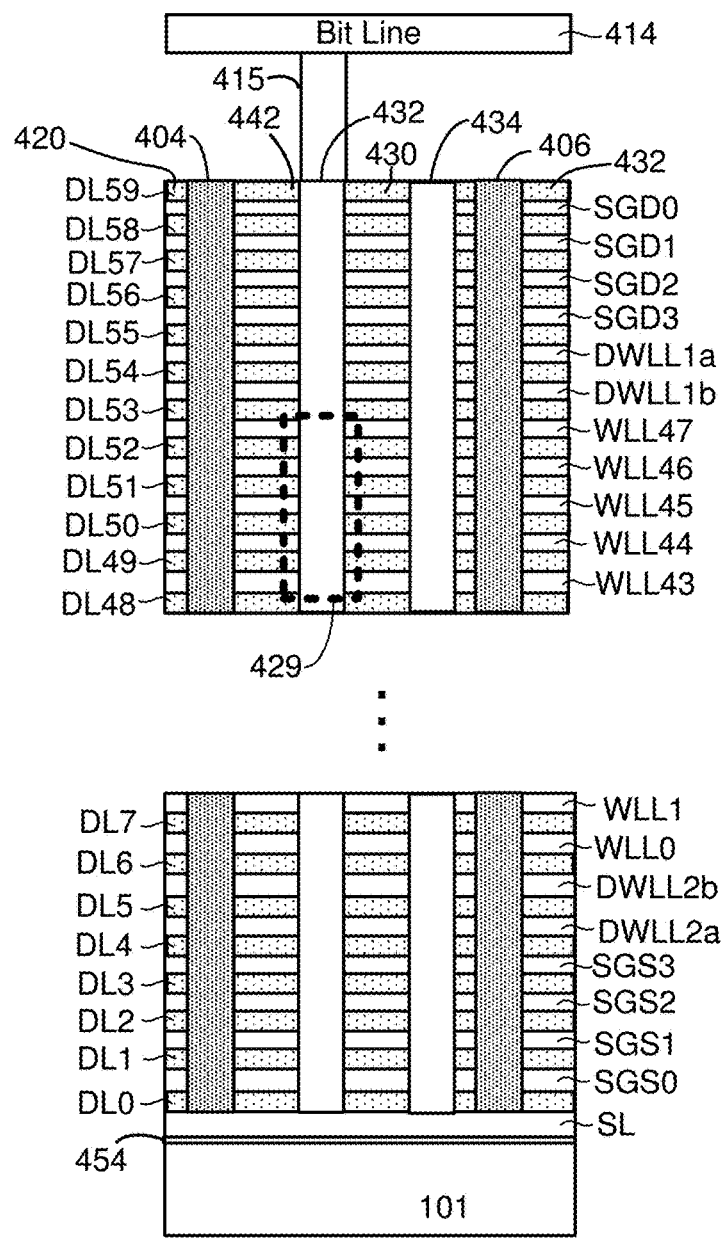
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1*a*, DWLL1*b*, DWLL2*a* and DWLL2*b*; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1*a*, DWLL1*b*, DWLL2*a* and DWLL2*b*; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
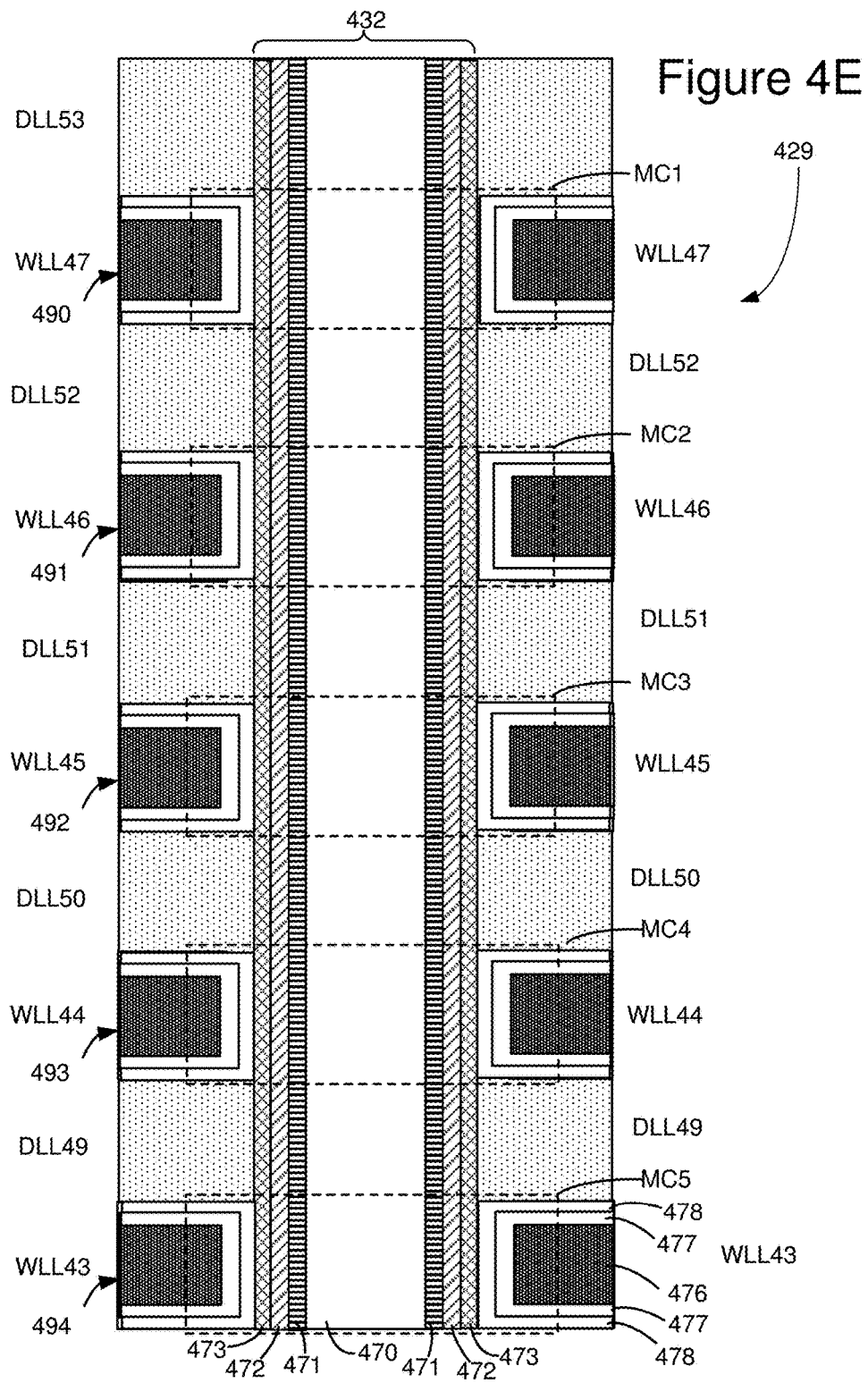
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
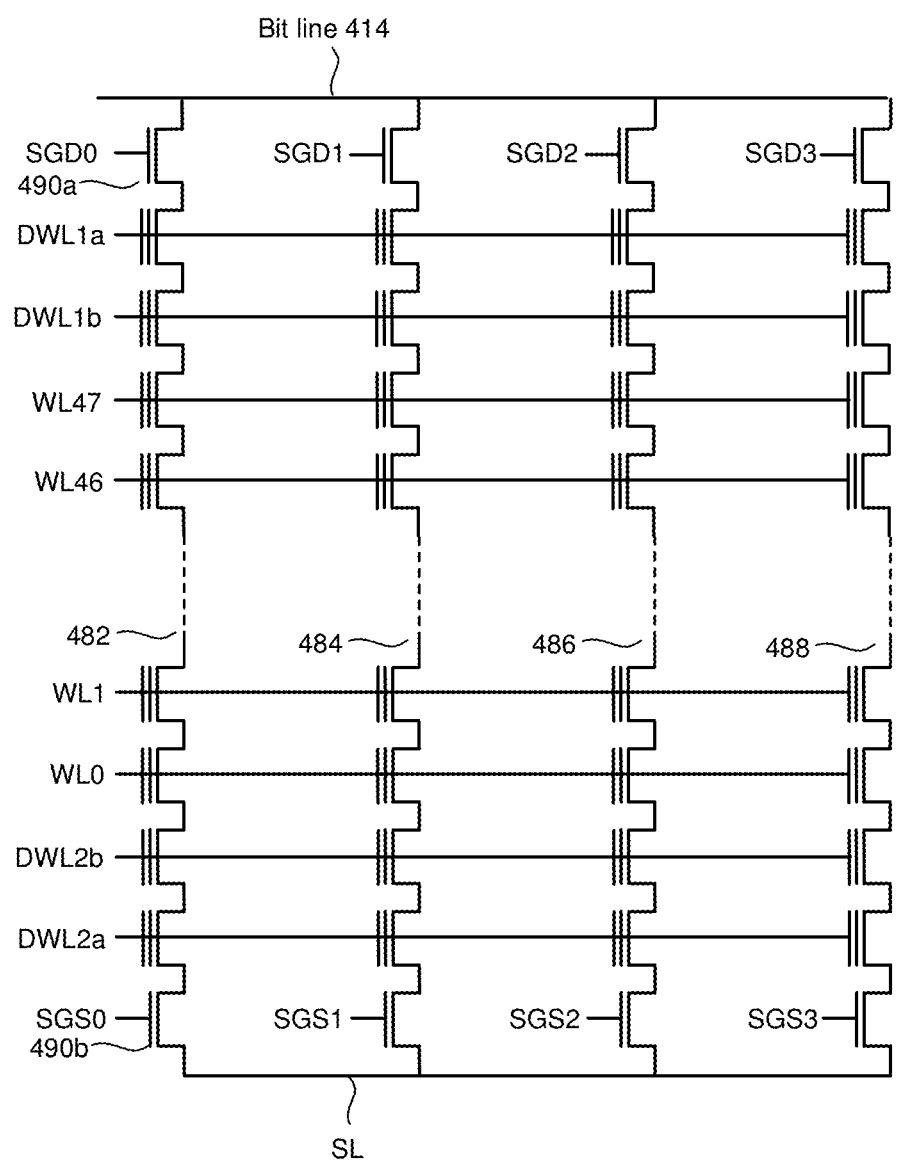
FIG. 4F is a schematic of a plurality of NAND strings.

FIG. 4F is a logical circuit diagram depicting a plurality of groups of connected programmable and erasable non-volatile memory cells arranged as four NAND strings 482, 484, 486 and 488 connected to bit line 414 and source line SL. The select lines SGD0, SGD1, SGD2, SGD3, SGS0, SGS1, SGS2, AND SGS3 are used to select/unselect the depicted NAND strings. In one embodiment all four drain side select lines (SGD0, SGD1, SGD2, SGD3) connect to each NAND string, but logically only one select line is used to select (actuate) each NAND strings. For example, SGD0 is used to select NAND string 482 to connect NAND string 482 to bit line 414, SGD1 is used to select NAND string 484 to connect NAND string 484 to bit line 414, SGD2 is used to select NAND string 486 to connect NAND string 486 to bit line 414, SGD3 is used to select NAND string 488 to connect NAND string 488 to bit line 414. Similarly, in one embodiment all four drain side select lines (SGS0, SGS1, SGS2, SGS3) connect to each NAND string, but logically only one select line is used to select (actuate) each NAND strings. For example, SGS0 is used to select NAND string 482 to connect NAND string 482 to common source line SL, SGS1 is used to select NAND string 484 to connect NAND string 484 to common source line SL, SGS2 is used to select NAND string 486 to connect NAND string 486 to common source line SL, SGS3 is used to select NAND string 488 to connect NAND string 488 to common source line SL. For example, to connect NAND string 482 to bit line 414, select gate 490b must be turned on (via select line SGD0) and to connect NAND string 482 to source line SL, select gate 490b must be turned on (via select line SGS0).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Adjacent data states are data states that are next to each other with respect to threshold voltage (or other attribute used to determine data value). For example, data states S3 and S4 are adjacent data states, and data states S6 and S7 are adjacent data states.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming) In some embodiments, data states S1-S7 can overlap, with controller 122 relying on ECC to identify the correct data being stored.

FIG. 5 shows a programming process that includes one phase where all memory cells connected to the same word line are programmed concurrently during that one phase. FIGS. 5A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 5A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 5B.

Memory cells being programmed to intermediate state IM are programmed to a target threshold voltage of VvIM.

During the second phase of the programming process of FIGS. 15A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 5C.

Figure 5A:
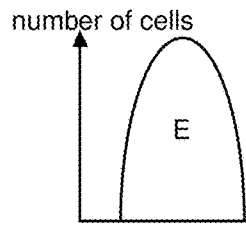
FIGS. 5A-E show various threshold voltage distributions and describe a process for programming non-volatile memory.
Figure 5B:
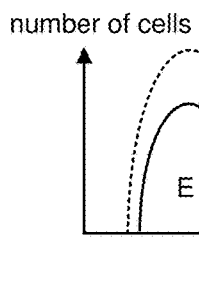
Figure 5C:
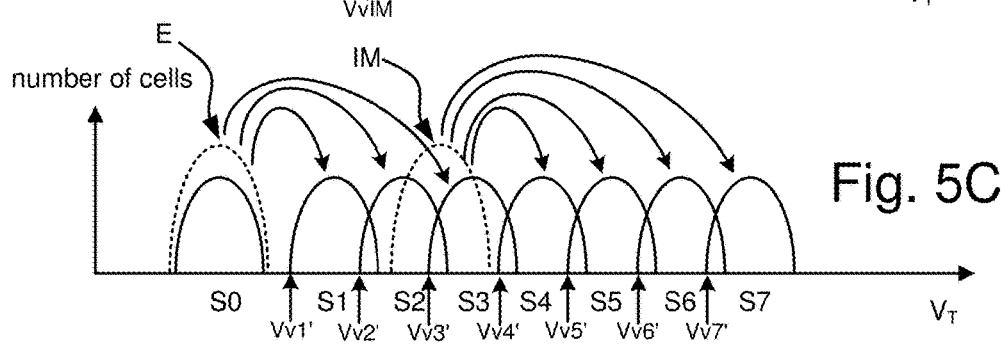
Figure 5D:
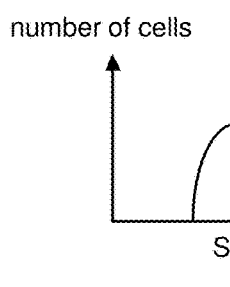
Figure 5E:
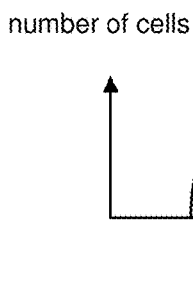

As can be seen in FIG. 5C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 5D. The final result of the three phrase programming process is depicted in step 5E, which shows data states S0-S7. In some embodiments, data state S0 is wider than data states S1-S7. FIG. 5F shows one example of how data is encoded for the data states of FIGS. 5A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 6A:
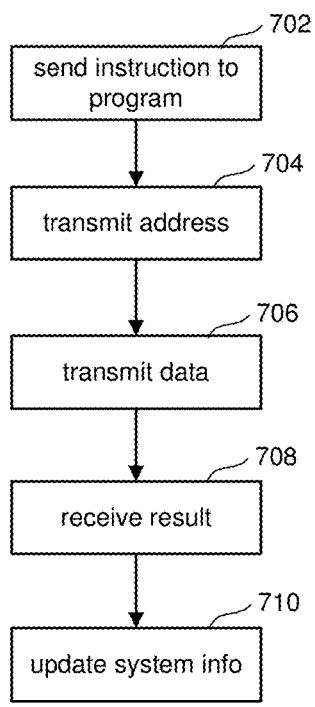
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more logical addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive user data and an instruction to program from the host, and the controller would run the ECC engine to create code words from the user data. These code words are the data transmitted in step 706.

Figure 6B:
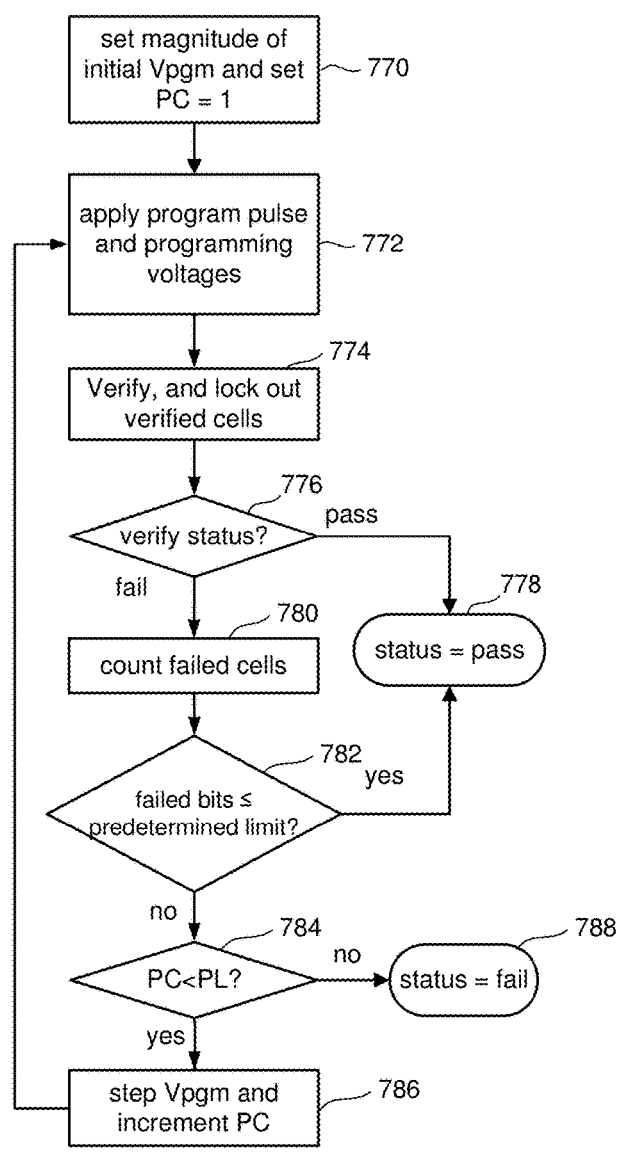
FIG. 6B is a flow chart describing one embodiment of a process for programming.

FIG. 6B is a flowchart describing one embodiment of a process for programming. The process of FIG. 6B is performed by the memory die in response to the steps of FIG. 6A (in response to the instructions, data and addresses from controller 122). In one example embodiment, the process of FIG. 6B is performed on memory die 108 using the one or more control circuits discussed above, at the direction of state machine 112. The process of FIG. 6B can also be used to implement the full sequence programming discussed above with respect to FIG. 5. Additionally, the process of can be used to implement each phase of a multi-phase programming process, such as the process of FIGS. 5A-E.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16 volts or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

It is contemplated that steps 772-786 will be performed multiple times during a common programming process. Each performance of steps 772-786 is referred to as an iteration of the programming process. As other programming processes may have different steps, but will also be repeated, these other programming process will also include performing multiple iterations of a programming process.

In order to achieve higher memory capacity for a fixed die size, components of memory systems are being packed more closer together. Doing so, however, may result in a greater number of manufacturing defects, such as word line defects which include shorting between word lines and other components (such as shorting between adjacent word lines, shorting between word lines and interconnects, shorting between word lines and the substrate) as well as broken word lines. Such defects often result in corruption of data stored on the word lines being programmed and nearby (e.g., adjacent) word lines. In some cases, these defects do not start effecting performance/function of the memory system until the memory system has been used for one or more program-erase cycles. Previous attempts to test for latent defects compares the results of one programming process to a previously successful programming poorness. The problem with this approach is that if the defect is not identified until after the completing of the current programming process, then it is possible that defect has caused corruption of nearby data during the current programming process. For example, consider two adjacent word lines: WLX and WLX+1, and assume that WLX+1 has a short. First, the memory cells connected to WLX program successfully. Subsequently, the memory cells connected to WLX+1 are programmed. However, due to a defect associated with WLX+1, the programming of the memory cells connected to WLX+1 causes corruption of the data stored in the memory cells connected to WLX (ie due to a word line to word line short). If the system determines that there is a short associated with WLX+1 after completing programming the memory cells connected to WLX+1, then the data stored in the memory cells connected to WLX can be lost. Therefore, the technology proposed herein seeks to determine that there is a defect earlier in the programming of WLX+1 in an attempt to stop the programming of WLX+1 prior to corrupting the data stored in the memory cells connected to WLX.

FIG. 7 is a flow chart describing one embodiment of a process that includes terminating programming of memory cells prior to completing programming of the memory cells if a defect condition exists. A defect condition is the existence of an actual defect or the symptoms of a defect. A non-limiting list of examples of defects includes broken word lines, shorting between adjacent word lines, shorting between word lines and interconnects, shorting between word lines and the substrate, etc. In one example embodiment, completing programming includes successfully programming data or ending programming after a predetermined number of attempts to program (e.g., after the number of iteration of the programming process reaches a limit—PC≥PL, as per step 784 of FIG. 6B). FIG. 7 can be performed by state machine 112, control circuitry 110, controller 122 and/or any of the one or more control circuits described above.

The process of FIG. 7 can be performed concurrently and in conjunction with the process of FIG. 6B. For example, step 802 of FIG. 7 includes commencing programming of a plurality of non-volatile memory cells (e.g., memory cells connected to a common word line) and can be implemented as starting the process of FIG. 6B. In step 804, the system determines whether a defect condition exists. If not defect condition is detected, then in step 806 the system determines whether programming is complete (e.g., steps 778 or 788 of FIG. 6B). If programming is complete, then the result (pass/successful or fail/unsuccessful) is reported (see step 708 of FIG. 6A) in step 808. If programming is not complete, the programming continues in step 810 (e.g., another iteration of the programming process of FIG. 6B is performed).

If, in step 804, the system determines that a defect condition exists, then the process continues at step 812. In response to determining that the defect condition exists in step 804, step 812 includes terminating the programming of the plurality of memory cells prior to completing programming (e.g. successfully programming data or ending programming after a predetermined number of attempts to program). Thus, programming is stopped earlier than in other prior systems. In step 814, the data being programmed (ie the data being programmed into the memory cells connected to the selected word line) is re-programmed to a different word line in a different block in response to the terminating programming. The re-programming can be at the direction of the controller or state machine, or other control circuit. Because it is possible that a defect in the word line currently selected for programming could corrupt data in adjacent or nearby word lines, then in step 816 data stored in memory cells connected to adjacent or nearby word lines is read and re-programmed to memory cells connected to another word line in the different block.

FIG. 8 is a block diagram of one example of a set of components that can perform the process of FIG. 7. For example, FIG. 8 depicts control circuit 850 in communication with non-volatile memory cells 126. In one embodiment, memory cells 126 can include memory cells in a two dimensional structure or three dimensional structure (e.g., such as the structure depicted in FIGS. 4A-F). Any of various non-volatile technologies known in the art can be used to implement memory cells 126. Control circuit 850 includes programming circuit 852, defect detection circuit 854 and termination circuit 856. Programming circuit 852 is connected to the memory cells and is configured to perform a programming process on the memory cells, as described herein. In one embodiment, programming circuit 852 performs step 802, 806, 808, 810, 814 and 816 of FIG. 7. Defect detection circuit 854, also connected to the memory cells, is configured to detect an indication of a defect in the memory apparatus. In one embodiment, defect detection circuit 854 performs step 804 of FIG. 7. In one example, defect detection circuit 854 is configured to detect a short between the word line and another component (e.g., a word line, an interconnect, a substrate, a transistor, or other component, etc.) of the apparatus by comparing a count of programming iterations (See FIG. 5B) for different data states of the memory cells during a common programming process. Termination circuit 856 is connected to the programming circuit, and is configured to stop programming of the memory cells prior to completion of the programming process in response to the defect detection circuit. In one embodiment, termination circuit 856 performs step 812 of FIG. 7.

In one example implementation, programming circuit 852, defect detection circuit 854 and termination circuit 856 are electrical circuits that are implemented on the same semiconductor chip as non-volatile memory cells 126. In other embodiments, programming circuit 852, defect detection circuit 854 and termination circuit 856 can be implemented on a separate semiconductor chip. In one embodiment, programming circuit 852, defect detection circuit 854 and termination circuit 856 are implemented as one single electrical circuit that can perform the multiple functions. For example, that single electrical circuit is referred to as control circuit 850 in FIG. 8. In one example, control circuit 850 can be implemented by state machine 112, control circuitry 110, and/or controller 122, or any one or more of the control circuits described above, or another circuit in the memory system.

FIG. 9 is a flow chart describing one embodiment of a process for determining whether a defect condition exists. Thus, the process of FIG. 9 is one example implementation of step 804 of FIG. 7. In the embodiment of FIG. 9, the system includes multiple planes (e.g., FIG. 4A) and determines that a defect condition exists if one of the planes programs faster or slower than another one or more planes by a first amount. In one example, the first amount is a number of iterations of a programming process. Examples of the first amount include (but are not limited to) 2, 3 or 4 iterations of the programming process; however, other numbers of iterations and/or other types of amounts can also be used. One embodiment includes the control circuit recording a number of iterations of the programming process for a first plane to complete programming for a particular state and terminating programming prior to completing programming for a second plane for the particular state when the second plane experiences a number of iterations of the programming process for the particular state that exceeds the number of iterations of the programming process for the first plane to complete programming for the particular state by the first amount. Variations can also be implemented.

Step 902 of FIG. 9 includes performing a verification process (see step 774 of FIG. 6B). Many different verification processes known in the art can be implemented. In step 904, the system determines whether any of the multiple planes of memory cells has passed verification for any data state. In this example, memory cells in multiple planes (connected to the same or different word lines) are programmed concurrently. Step 904 includes determining if all of the memory cells in Plane A being programmed to data state X have been verified to have successfully completed programming. This is done for all data states and for all planes. So if there are M planes and 7 data states being programmed to, then there are 7×M combinations of planes/data states. If the system does determined that all of the memory cells in a plane being programmed to data state X have been verified to have successfully completed programming, then the current value of the program counter PC (representing the number of iterations of the programming process performed so far) is recorded for the plan/data state. One a value of PC is recorded for a plane/data state, then the system will not update the recorded value during this programming process. It may be that multiple planes/data states pass verification at the same time and have the same value of PC recorded.

After recording the PC for each plane/data state that passes verification in step 906, or after determining that no plane/state passed verification in step 904, the system will determine whether any plane/data state is programming slower than a different plan for the same data state. More specifically, the system will calculate Δ plane/data state combination, where Δ is equal to the difference between the current value of PC (the number of iteration of the current programming process so far) and a recorded PC for different plane/same data state. For example, Δ=4 if memory cells in plane 0 being programmed to state S3 are in the twelfth iteration of the programming process (PC=12) and memory cells in plane 1 being programmed to state S3 completed programming at the eighth iteration of the programming process. In one embodiment, Δ is only calculated for plane/data state combinations having a for different plane/same data state counterpart that has completed programming.

In step 910, the system determines whether Δ>max_Δ. Examples of max_Δ include (but are not limited to) 2, 3 or 4 iterations of the programming process; however, other numbers of iterations and/or other types of amounts can also be used. If Δ greater than max_Δ, then the system concludes that a defect condition exists and has been detected (step 912). If Δ is not greater than max_Δ, then the system concludes that a defect condition has not been detected (step 914). For example, if memory cells in plane 0 being programmed to state S3 are in the twelfth iteration of the programming process (PC=12) and memory cells in plane 1 being programmed to state S3 completed programming at the eight iteration of the programming process, then the system will conclude that a defect condition exists if max_Δ is 3 iterations of the programming process.

In some embodiments, step 902 of FIG. 9 is performed by programming circuit 852. In some embodiments, steps 904-914 of FIG. 9 are implemented defect detection circuit 854, control circuit 850, state machine 112, control circuitry 110, controller 122 and/or any of the one or more control circuits described above.

Figure 10:
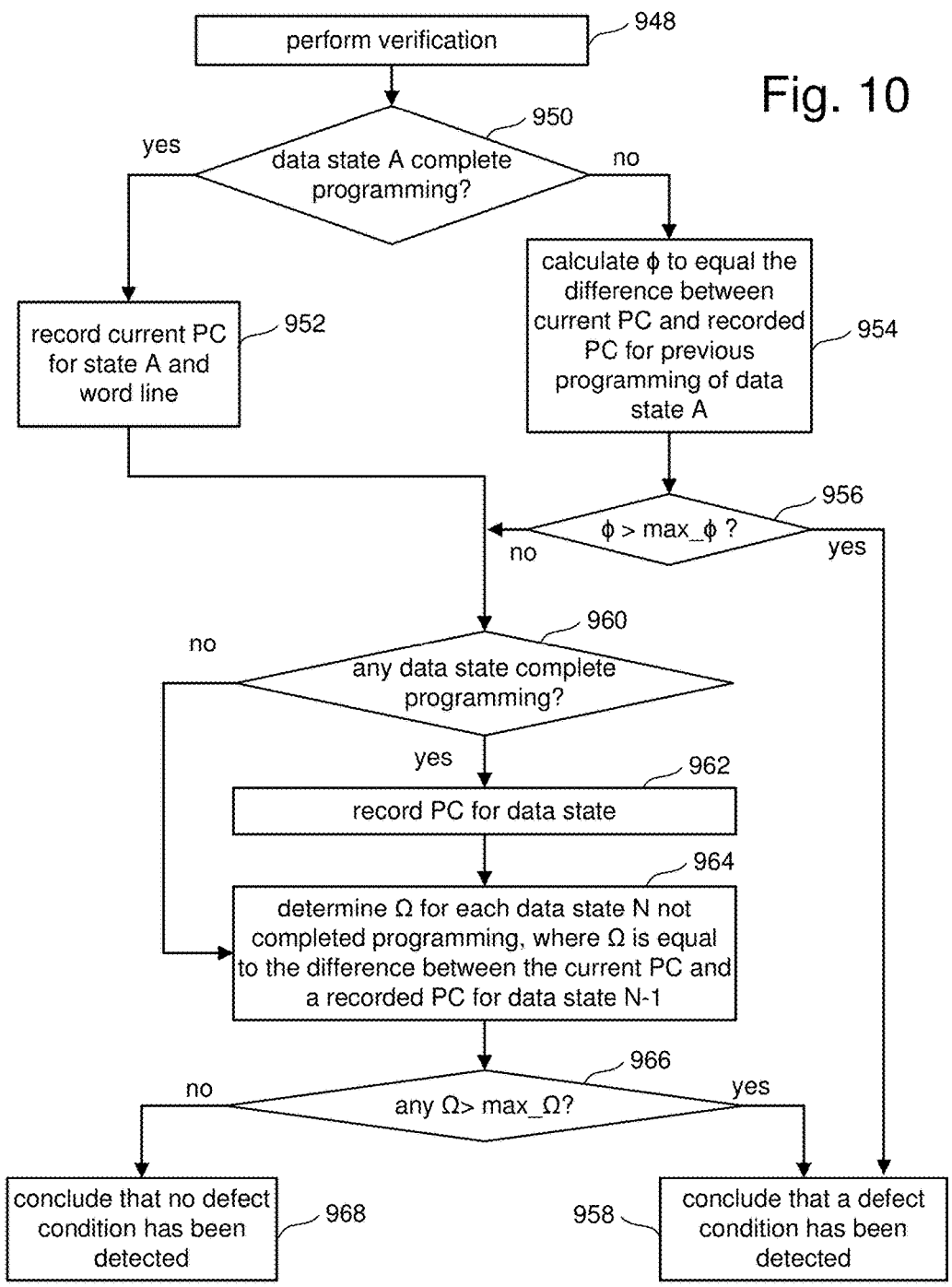
FIG. 10 is a flow chart describing one embodiment of a process for determining whether a defect condition exists.

FIG. 10 is a flow chart describing one embodiment of a process for determining whether a defect condition exists. Thus, the process of FIG. 10 is one example implementation of step 804 of FIG. 7. In the embodiment of FIG. 10, the system determines that a defect condition exists if a number of iterations of the programming process performed for a given data state exceeds a number of iterations of the programming process used to complete programming for an adjacent data state by more than a threshold. In one example, the threshold is based on a state-to-state difference in program cycles from a previous programming operation (e.g., on the same or a different word line). Because state S1 is adjacent the erased state S0, in one embodiment, the count of iterations of the programming process used to complete programming for state S1 for the currently selected word line is compared to the count of iterations of the programming process used to complete programming for state S1 for previously programmed word line (e.g., adjacent word line or other word line) in the same block.

Step 948 of FIG. 10 includes performing a verification process (see step 774 of FIG. 6B). Many different verification processes known in the art can be implemented. In step 950, the system determines whether all of the memory cells connected to the word line select for programming that are being programmed to state A have been verified to have successfully completed programming. If so, then the current value of the program counter PC (representing the number of iterations of the programming process performed so far) is recorded (e.g., stored in a register, RAM or the non-volatile memory) in step 952. If not, then the system calculates φ in step 954. In one embodiment, φ is equal to the difference between the current value of PC and the previously recorded value for PC for a previous programming of memory cells on a different word line (or the same word line) to data state A. In step 956, the system determined whether φ is greater than φ_max, where φ_max is some value used to test whether the differences programming speed is too large. In one embodiment, φ_max is 2, 3 or 4 iterations of the programming process; however, other numbers of iterations and/or other types of amounts can also be used. In another, φ_max is set to equal the φ calculated for a previous programming process. Thus, φ_max can be based on one of a parameter and a state-to-state difference in iterations of the programming process from a previous programming operation If the system determines that φ is greater than φ_max then the system concludes that a defect condition exists and has been detected (step 958). If the system determines that φ is not greater than φ_max, then the process continues at step 960. After step 952, the process also continues at step 960.

In step 960, the system determines whether any data state has completed programming That is, the system determines whether all memory cells being programmed to a same data state in the current programming process have been verified to have successfully completed programming. This may be performed for one plane, multiple planes together or multiple planes separately. If all of the memory cells being programmed to a same data state in the current programming process have been verified to have successfully completed programming, then the PC (the number of iteration of the current programming process so far) is recorded for that data state in step 962. It is possible that multiple data states complete programming at the same iteration of the current programming process, in which case the same PC would be recorded for the multiple data states.

If the system determined that there are no data states which completed programming in the current iteration of the current programming process, the process continues at step 964 and the system calculates Ω for each data state that has not completed programming (ie all of the memory cells being programmed to that data state have not been verified to have successfully completed programming) The process also continues at step 964 after step 962. The system calculates S2 for state N as the difference between the current PC and the recorded PC for state N−1 (if state N−1 has completed programming). In step 966, the system determines whether Ω>max_Ω for any data state N. The value max_Ω is some value used to test whether the differences programming speed is too large. In one embodiment, max_Ω is 2, 3 or 4 iterations of the programming process; however, other numbers of iterations and/or other types of amounts can also be used. In another, max_Ω is set to equal the Ω calculated for a previous programming process on the same or a different word line. In some embodiments, max_Ω is the same for all data states. In other embodiments, max_Ω is the different for different data states. If the system determined that Ω>max_Ω for any data state N, then the system concludes that a defect condition exists and has been detected in step 958. If the system did not identify any data state for which Ω>max_Ω, then the system concludes that no defect condition has been detected.

In some embodiments, step 948 of FIG. 10 is performed by programming circuit 852. In some embodiments, steps 950-968 of FIG. 10 are implemented defect detection circuit 854, control circuit 850, state machine 112, control circuitry 110, controller 122 and/or any of the one or more control circuits described above.

The above-described technology allows for earlier detection of defects in order to prevent corrupting of data.

One embodiment includes an apparatus comprising a plurality of non-volatile memory cells and a control circuit connected to the non-volatile memory cells. The control circuit is configured to program the memory cells and terminate programming of the memory cells prior to completing programming of the memory cells if a defect condition exists.

One embodiment includes an apparatus comprising a plurality of non-volatile memory cells; a programming circuit connected to the memory cells and configured to perform a programming process on the memory cells; a defect detection circuit configured to detect an indication of a defect in the apparatus; and a termination circuit connected to the programming circuit, the termination circuit configured to stop programming of the memory cells prior to completion of the programming process in response to the defect detection circuit.

One embodiment includes a method comprising commencing programming of a plurality of non-volatile memory cells; determining that a defect condition exists; and in response to determining that the defect condition exists, terminating the programming of the plurality of memory cells prior to successfully programming data and prior to ending programming after a predetermined number of attempts to program.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells; and
a control circuit connected to the non-volatile memory cells, the control circuit configured to program data to a first set of the memory cells and terminate programming of the data to the first set of the memory cells prior to completing programming of the data to the first set of the memory cells if a defect condition exists, the control circuit configured to program the data to a second set of the memory cells after terminating programming of the data to the first set of the memory cells.

2. The apparatus of claim 1, wherein:
the control circuit is configured to determine that the defect condition exists.

3. The apparatus of claim 1, wherein:
completing programming includes successfully programming the data or ending programming after a predetermined number of attempts to program.

4. The apparatus of claim 1, wherein:
the control circuit configured to program multiple planes of memory cells; and
the control circuit configured to determine that the defect condition exists if one of the planes programs faster or slower than another one or more planes by a first amount.

5. The apparatus of claim 4, wherein:
the first amount is a number of iterations of a programming process.

6. The apparatus of claim 5, wherein:
the control circuit is configured to record a number of iterations of a programming process for a first plane to complete programming for a particular data state; and
the control circuit is configured to terminate programming prior to completing programming for a second plane for the particular data state when the second plane experiences a number of iterations of the programming process for the particular data state that exceeds the number of iterations for the first plane to complete programming for the particular data state by the first amount.

7. The apparatus of claim 1, wherein:
the control circuit is configured to program the memory cells to multiple data states using a program process that includes multiple iterations; and
the control circuit is configured to determine that the defect condition exists if a number of iterations of the programming process performed for a given data state exceeds a number of iterations of the programming process used to complete programming for an adjacent data state by more than a threshold.

8. The apparatus of claim 7, wherein:
the threshold is based on one of a parameter and a state-to-state difference in iterations of the programming process from a previous programming operation.

9. The apparatus of claim 1, wherein:
the memory cells are connected to a common word line; and
the control circuit is configured to determine that the defect condition exists based on comparing programming speed for different data states of the memory cells connected to the common word line during a common programming process.

10. The apparatus of claim 1, wherein:
the control circuit is configured to program the memory cells to multiple data states using a program process that includes multiple programming iterations, the multiple data states includes a first data state and additional data states;
the plurality of memory cells are connected to a first word line; and
the control circuit is configured to determine that the defect condition exists if a number of programming iterations performed on the plurality of memory cells connected to the first word line for the first data state exceeds a number of programming iterations used to complete programming of memory cells connected to a second word line for the data state by more than a first amount.

11. The apparatus of claim 1, wherein:
the memory cells are connected to a first word line in a first block;
the control circuit is configured to re-program the data destined to a different word line in a different block in response to the terminating programming;

the control circuit is configured to re-program data that is stored in memory cells connected on a word line adjacent to the first word line to memory cells connected to another word line in the different block; and the defect condition includes a word line defect.

12. The apparatus of claim 1, wherein:

the plurality of non-volatile memory cells are arranged in a three dimensional structure.

13. An apparatus, comprising:

a plurality of non-volatile memory cells;

a programming circuit connected to the memory cells and configured to perform a programming process on the memory cells;

a defect detection circuit configured to detect an indication of a defect in the apparatus; and a termination circuit connected to the programming circuit, the termination circuit configured to stop programming of the memory cells prior to completion of the programming process in response to the defect detection circuit, the programming circuit performs re-programming to a different set of memory cells in response to the defect detection circuit.

14. The apparatus of claim 13, wherein:

the defect detection circuit detects the indication of the defect during the programming process, prior to completion of the programming process.

15. The apparatus of claim 14, further comprising:

a word line connected to the plurality of non-volatile memory cells, the defect detection circuit configured to detect a short between the word line and another component of the apparatus by comparing a count of programming iterations for different data states of the memory cells during a common programming process.

16. A method, comprising:

commencing programming of a plurality of non-volatile memory cells;

determining that a defect condition exists;

in response to determining that the defect condition exists, terminating the programming of the plurality of memory cells prior to successfully programming data and prior to ending programming after a predetermined number of attempts to program; and re-programming data destined for the memory cells to a different location in response to terminating the programming.

17. The method of claim 16, wherein:

the programming of a plurality of non-volatile memory cells includes programming multiple planes of memory cells; and the determining that the defect condition exists includes determining if one of the planes programs faster or slower than another one or more planes by a first amount.

18. The method of claim 16, wherein:

the programming of a plurality of non-volatile memory cells includes programming the memory cells to multiple data states using a program process that includes multiple iterations; and the determining that the defect condition exists includes determining whether a number of iterations performed for a given data state exceeds a number of iterations used to complete programming for an adjacent data state by more than a first amount.

19. The method of claim 16, wherein:

the memory cells are connected to a common word line; and the determining that the defect condition exists includes comparing programming speed for different data states of the memory cells connected to the common word line during a common programming process.

20. The method of claim 16, wherein:

the plurality of non-volatile memory cells are arranged in a three dimensional structure.

* * * * *

UNITED STATES PATENT AND TRADEMARK OFFICE
CERTIFICATE OF CORRECTION

| | | |
|---|---|---|
| PATENT NO. | : 9,570,160 B1 | Page 1 of 1 |
| APPLICATION NO. | : 14/967157 | |
| DATED | : February 14, 2017 | |
| INVENTOR(S) | : Shah et al. | |

It is certified that error appears in the above-identified patent and that said Letters Patent is hereby corrected as shown below:

On the Title Page

Item (54) and in the Specification, Column 1, Line 2, Title, please change "DETETCTION AND" to -- DETECTION AND --

Signed and Sealed this
Third Day of July, 2018

Andrei Iancu
*Director of the United States Patent and Trademark Office*